US007658859B2

(12) United States Patent
Hayashi

(10) Patent No.: US 7,658,859 B2
(45) Date of Patent: Feb. 9, 2010

(54) METHOD OF PROCESSING ORGANIC FILM USING PLASMA ETCHING AND METHOD OF MANUFACTURING SEMICONDUCTOR DEVICE

(75) Inventor: Hisataka Hayashi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 550 days.

(21) Appl. No.: 11/348,239

(22) Filed: Feb. 7, 2006

(65) Prior Publication Data

US 2006/0191867 A1 Aug. 31, 2006

(30) Foreign Application Priority Data

Feb. 8, 2005 (JP) ............................ 2005-032169

(51) Int. Cl.
*B44C 1/22* (2006.01)
*C03C 15/00* (2006.01)
*C03C 25/68* (2006.01)
*C23F 1/00* (2006.01)

(52) U.S. Cl. ........................................ 216/67; 438/710

(58) Field of Classification Search ................ 438/706, 438/710, 714, 719, 723, 724, 725; 216/67, 216/74, 79

See application file for complete search history.

(56) References Cited

U.S. PATENT DOCUMENTS 5,730,808 A * 3/1998 Yang et al. .................. 136/249
6,277,733 B1 * 8/2001 Smith ......................... 438/636
6,444,533 B1 * 9/2002 Lyding et al. ............... 438/308
6,599,829 B2 7/2003 Smith et al.
6,635,185 B2 * 10/2003 Demmin et al. ............... 216/64
6,888,204 B1 * 5/2005 Lyding et al. ............... 257/405
7,001,848 B1 * 2/2006 Smith et al. ................. 438/725
2002/0127840 A1 * 9/2002 Smith et al. ................. 438/618
2003/0216026 A1 * 11/2003 Mukherjee-Roy et al. ... 438/622
2004/0121609 A1 * 6/2004 Lee et al. .................... 438/709
2006/0281312 A1 * 12/2006 Smith et al. ................. 438/689

FOREIGN PATENT DOCUMENTS

JP 6-84841 3/1994
JP 2002-93778 3/2002
JP 2002-543613 12/2002
WO WO 2004/027826 A2 4/2004

OTHER PUBLICATIONS

Notification of Reason for Rejection issued by the Japanese Patent Office on Nov. 4, 2008, for Japanese Patent Application No. 2005-032169, and English-language translation thereof.

* cited by examiner

*Primary Examiner*—Roberts Culbert
(74) *Attorney, Agent, or Firm*—Finnegan, Henderson, Farabow, Garrett & Dunner, L.L.P.

(57) ABSTRACT

A method of forming an organic film disposes a substrate on which the organic film is formed in a chamber capable of reducing a pressure therein, introduces a gas including a deuterium compound or a trideuterium compound in the chamber, to generate a plasma by ionizing the gas; and etches and patterning the organic film by the plasma.

17 Claims, 6 Drawing Sheets

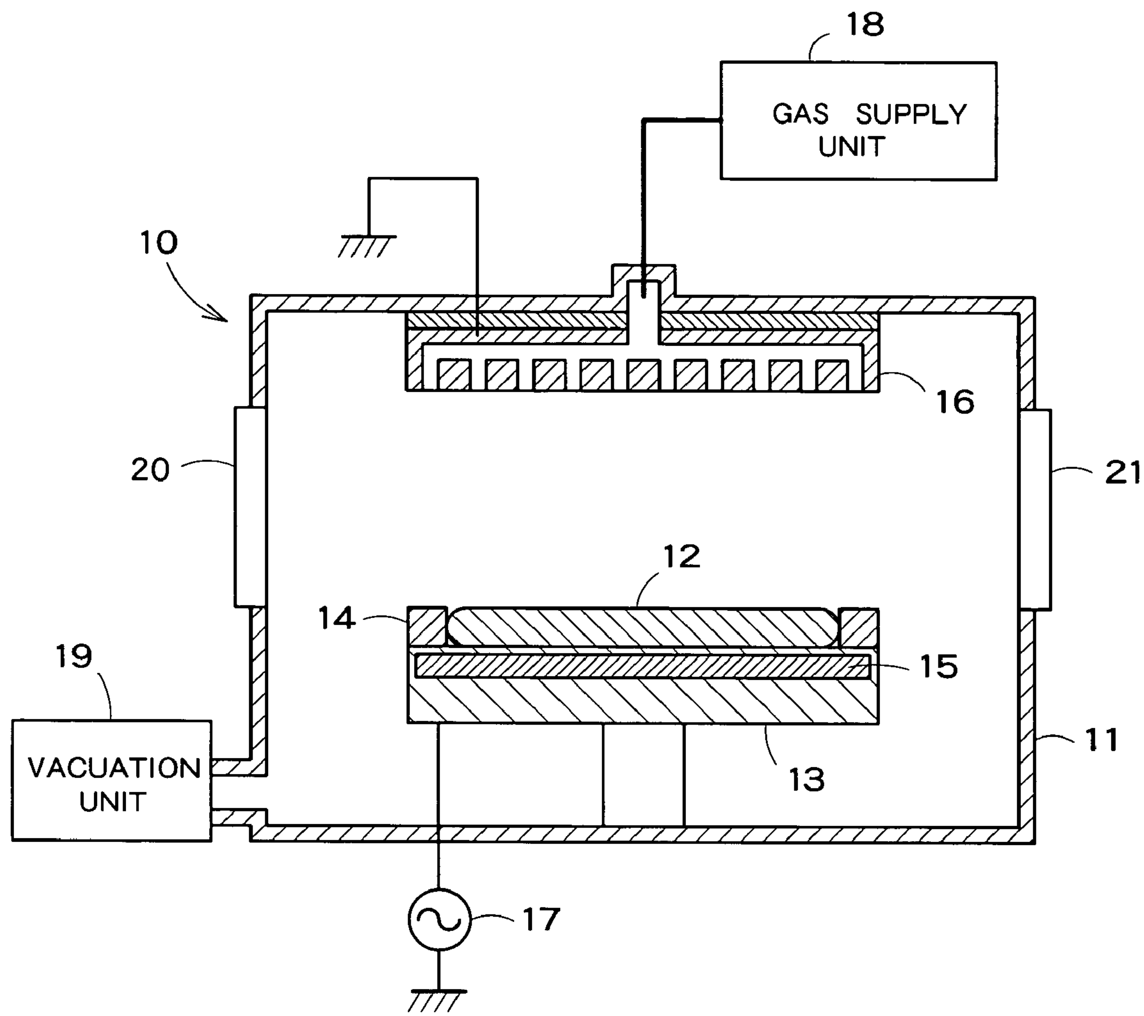
10 ···PLASMA ETCHING APPARATUS
11 ···CAMBER
12 ···SUBSTRATE
13 ···LOWER ELECTRODE
14 ···FOCUS RING
15 ···TEMPERATURE ADJUSTING MECHANISM
16 ···NOZZLE UNIT
17 ···HIGH-FREQUENCY POWER SOURCE
20, 21···INSIDE OBSERVATION WINDOW
F I G. 1

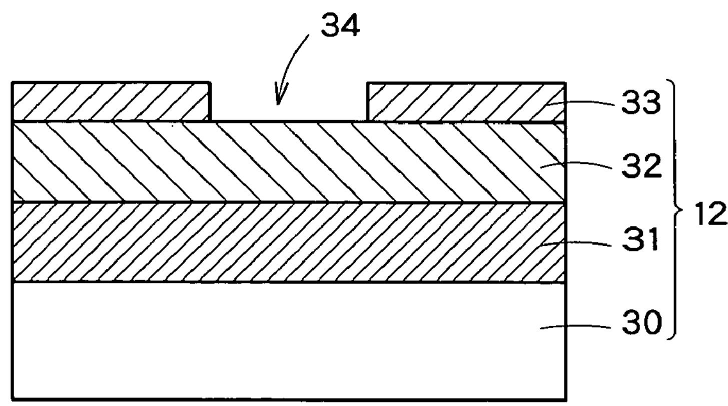
F I G. 2
PLASMA
$ND_3$ GAS ⟶ ION ($ND_2^+$ 、$D^+$)、RADICAL ($ND_2^*$ 、$D^*$)
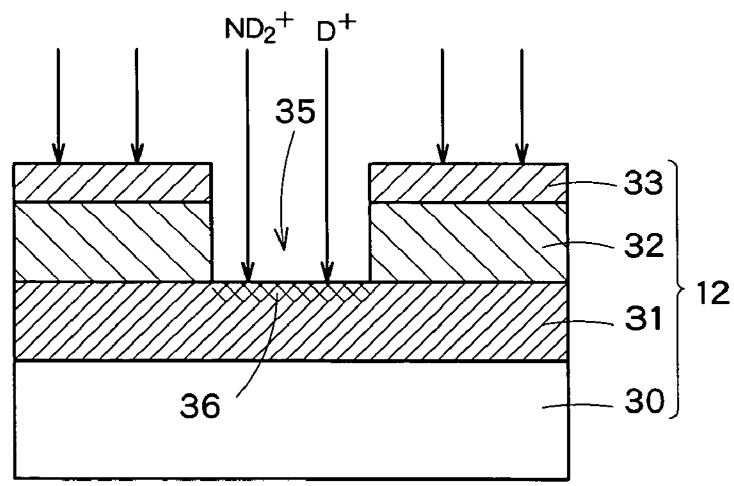
30 ···SILICON SUBSTRATE
31 ···UNDERLAYER FILM
32 ···ORGANIC FILM
33 ···PROTECTIVE FILM
34 ···OPENING
35 ···TRENCH
36 ···ION ENTRY REGION
F I G. 3

40 ···ENTRY REGION OF $ND_2$ ION
41 ···ENTRY REGION OF D ION
42 ···UNDERLAYER FILM
43 ···ENTRY REGION OF $NH_2$
44 ···ENTRY REGION OF H ION

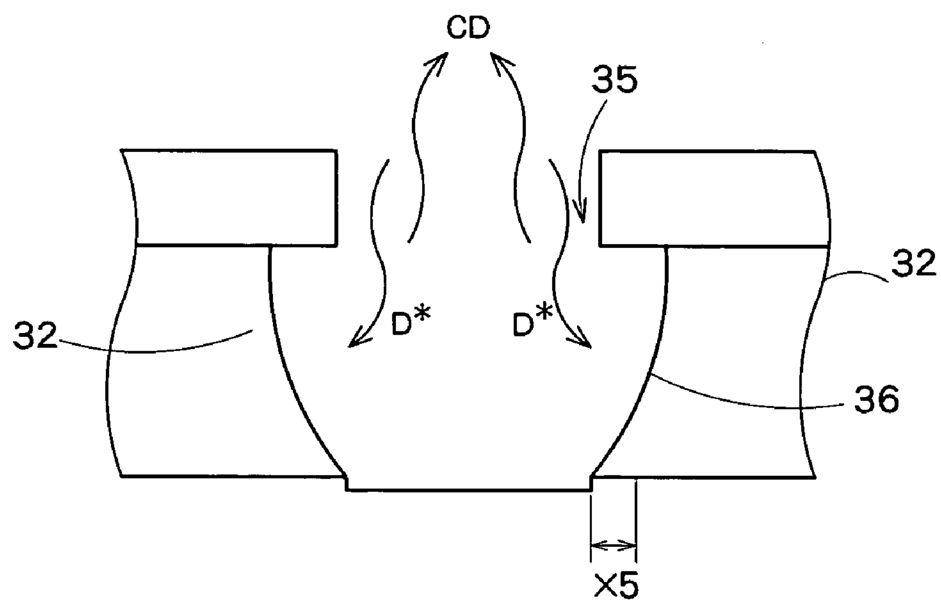
F I G. 5
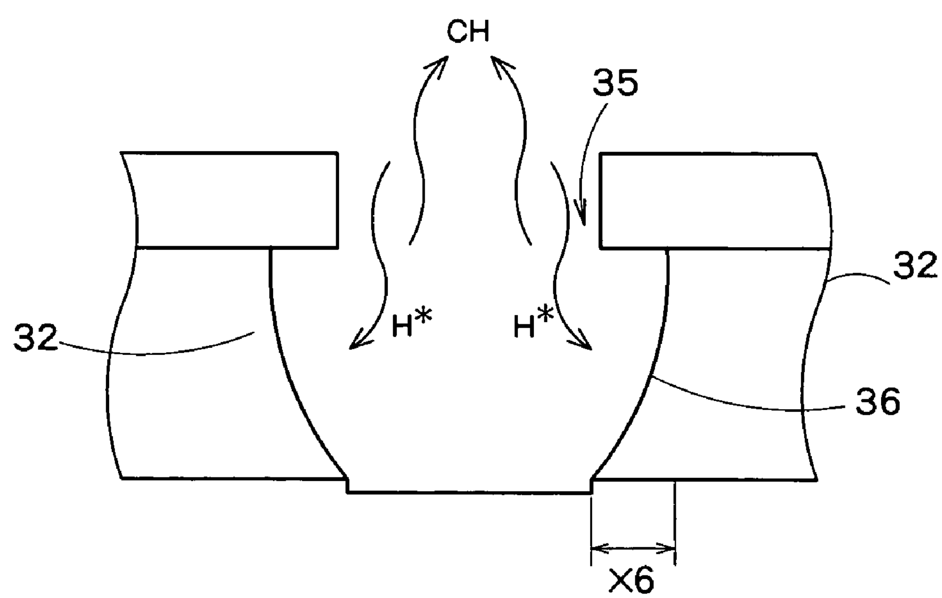
F I G. 6

$ND_3$ GAS —PLASMA→ ION ($ND_2^+$ 、$D^+$)、RADICAL ($ND_2^*$ 、$D^*$)

50 ···SILICON SUBSTRATE
51 ···UNDERLYING FILM
52 ···DIELECTRIC FILM
53 ···ORGANIC FILM
54 ···OPENING
55 ···TRENCH
56 ···SIDE WALL

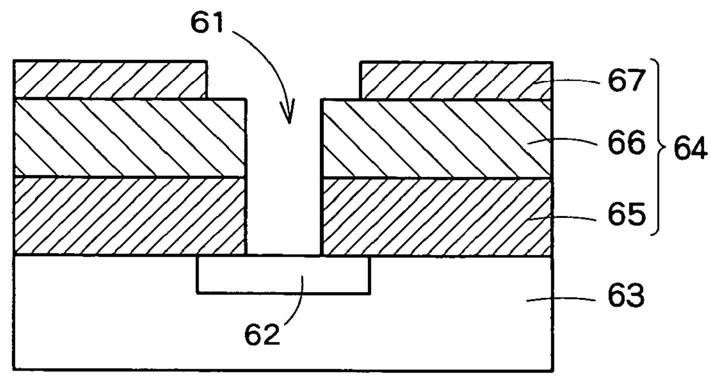
F I G. 9
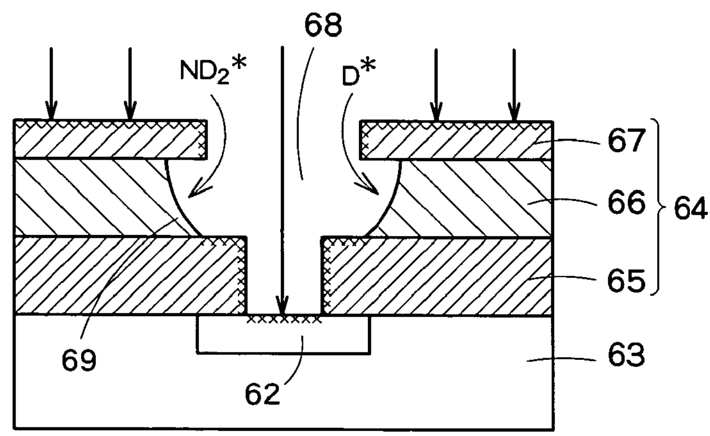
F I G. 10
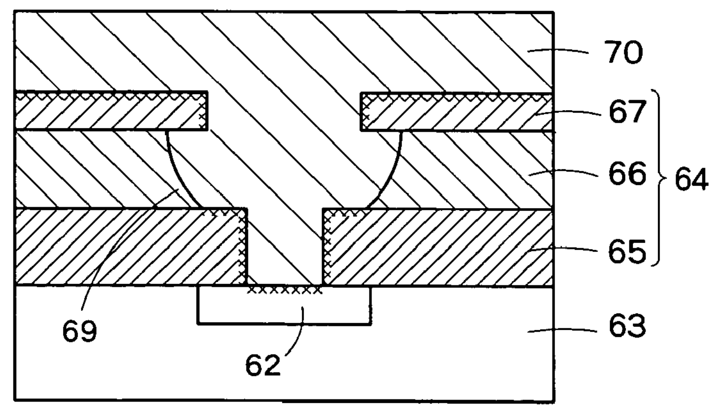
F I G. 11

METHOD OF PROCESSING ORGANIC FILM USING PLASMA ETCHING AND METHOD OF MANUFACTURING SEMICONDUCTOR DEVICE

CROSS REFERENCE TO RELATED APPLICATIONS

This application is based upon and claims the benefit of priority from the prior Japanese Patent Application No. 2005-32169, filed on Feb. 8, 2005, the entire contents of which are incorporated herein by reference.

BACKGROUND OF THE INVENTION

1. Field of the Invention

The present invention relates to a method of processing an organic film and a method of manufacturing a semiconductor device, in which a plasma etching is used.

2. Related Art

Dry etching which uses radicals generated by plasma discharge is widely used as a method of processing a semiconductor substrate or a method of processing various thin films formed on a semiconductor substrate.

In a case where a trench is formed in an organic film by using a protective film pattern disposed on the organic film as a mask, if plasma etching is performed using a gas which contains hydrogen as a main component, there arises the problem that a plasma causes not negligible damage to an underlayer film exposed to the bottom part of the trench of the organic film.

Particularly, with miniaturization and high integration of the semiconductor device, when a dielectric film having a smaller dielectric constant than that of a silicon oxide film is used as an underlayer film, the above-described damage may easily occur.

Plasma etching techniques which form trenches in a silicon substrate by using a gas which contains deuterium ($D_2$) as a main component have hitherto been known. For example, see the Japanese Patent Laid-Open No. 6-84841 (page 2, FIG. 1).

In the plasma etching technique disclosed in the above patent document, trenches are formed in a silicon substrate by performing plasma etching using a silicon oxide film as a mask and using a gas which contains deuterium as a main component. In this technique, etching rates which are an order of magnitude higher than when hydrogen ($H_2$) gas is used are obtained.

However, the above patent document discloses only an example in which a silicon substrate is etched by a gas which contains deuterium as a main component. Furthermore, it neither discloses nor suggests gases other than deuterium.

SUMMARY OF THE INVENTION

A method of processing an organic film according to one embodiment of the present invention, comprising:

disposing a substrate on which the organic film is formed in a chamber capable of reducing a pressure therein;

introducing a gas including a deuterium compound or a trideuterium (that is, tritium) compound in the chamber, to generate a plasma by ionizing the gas; and etching and patterning the organic film by the plasma.

Furthermore, a method of processing an organic film according to another embodiment of the present invention, comprising:

disposing a substrate on which the organic film covered by a patterned protective film is formed in a chamber capable of reducing a pressure therein;

introducing a gas including a deuterium compound or a trideuterium compound in the chamber, to generate a plasma by ionizing the gas; and etching the organic film by the plasma by using the protective film as a mask.

Furthermore, a method of manufacturing a semiconductor device according to one embodiment of the present invention, comprising:

disposing a substrate which has a laminated film obtained by laminating an insulating film, an organic film and a patterned protective film in order in a chamber capable of reducing a pressure therein;

introducing a gas including a deuterium compound or a trideuterium compound in the chamber, to generate a plasma by ionizing the gas; and etching the organic film by the plasma by using the protective film as a mask.

BRIEF DESCRIPTION OF THE DRAWINGS

FIG. 1 is a schematic configuration diagram of a plasma etching apparatus used in a method of processing an organic film according to the first embodiment of the present invention.

FIG. 2 is a sectional view which shows an example of a section structure of the unprocessed workpiece substrate 12.

FIG. 3 is a sectional view which shows an example of a section structure of the processed workpiece substrate 12.

FIG. 5 is a sectional view which shows an example in which side wall parts of the organic film 32 are etched mainly by a D radical and an undercut region 36 is formed.

FIG. 6 is a sectional view which shows an undercut region 36 of the organic film 32 when plasma etching has been performed by using a gas which contains a hydrogen compound $NH_3$.

FIG. 9 is a manufacturing process diagram which shows a method of manufacturing a semiconductor device related to the second embodiment of the present invention.

FIG. 10 is a manufacturing process diagram subsequent to FIG. 9.

FIG. 11 is a manufacturing process diagram subsequent to FIG. 10.

DETAILED DESCRIPTION OF THE INVENTION

Figure 4A:
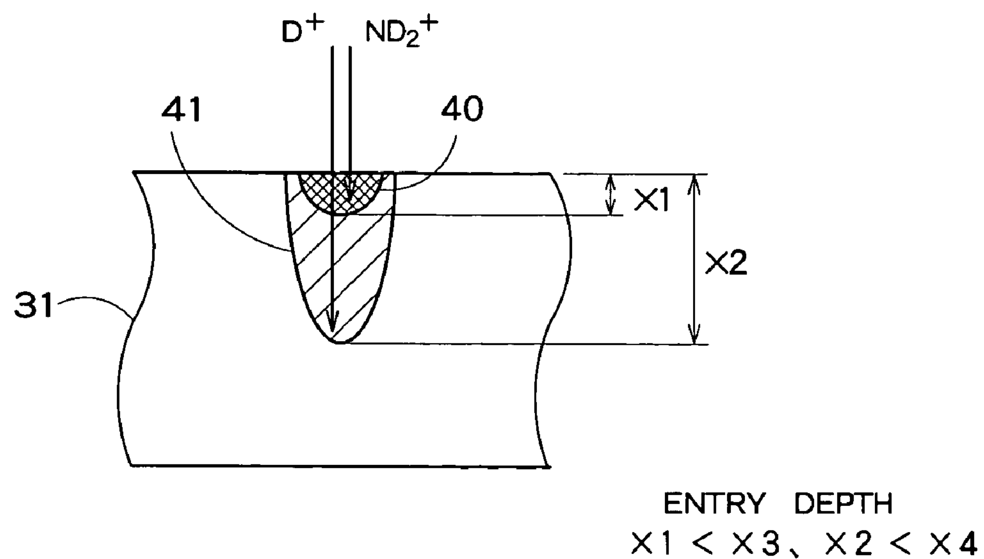
FIG. 4A is a sectional view which schematically shows a damaged region of this embodiment.

Hereinafter, embodiments of the present invention will be described with reference to the drawings.

First Embodiment

FIG. 1 is a schematic configuration diagram of a plasma etching apparatus used in a method of processing an organic film according to the first embodiment of the present invention. The plasma etching apparatus 10 shown in FIG. 1 is provided with a chamber 11 capable of reducing pressure therein, a lower electrode 13 provided within the chamber 11, a temperature adjusting mechanism 15 built in the lower electrode 13, a workpiece substrate 12 placed on the lower electrode 13, a focus ring 14 disposed in a manner of enclosing an outer circumferential part of the substrate 12, a nozzle unit 16 composed of multiple nozzles which introduce an etching gas into the chamber 11, a high-frequency power source 17 which supplies a high-frequency voltage to the lower electrode 13 in order to generate a plasma within the chamber 11, a gas supply unit 18 which supplies an etching gas, an evacuation unit 19 which reduces the pressure within the chamber 11, and inside observation windows 20, 21 which are provided on side walls of the chamber 11 and disposed opposite to each other.

The lower electrode 13 is a cathode electrode within the chamber 11 and the nozzle unit 16 is an anode electrode within the chamber 11.

The focus ring 14 is formed of silicon, for example, as a material and controls a plasma in the outer peripheral part of the workpiece substrate 12.

An etching gas is introduced into the chamber 11 from the gas supply unit 18 via the nozzle unit 16. In this state, the inside of the chamber 11 is kept in a pressure-reduced condition by the evacuation unit 19, and high-frequency power is supplied from the high-frequency power source 17. This leads to generation of a plasma within the chamber 11.

An etching gas is a gas which contains a deuterium compound or a trideuterium compound. An etching gas which contains a deuterium compound is made of a material which contains $D_2O$, $NH_2D$, $NHD_2$, $ND_3$, $CH_3D$, $CH_2D_2$, $CHD_3$ or $CD_4$ (D denotes deuterium). An etching gas which contains a trideuterium compound is made of a material which contains $T_2O$, $NH_2T$, $NHT_2$, $NT_3$, $CH_3T$, $CH_2T_2$, $CHT_3$ and $CT_4$ (T denotes trideuterium).

When a gas which contains a deuterium compound or a trideuterium compound is introduced into the chamber 11 and a high-frequency voltage of 100 to 5000 W is applied, with the pressure within the chamber 11 kept at 5 to 250 mTorr, for example, the gas which contains a deuterium compound or a trideuterium compound is excited and a plasma is generated under the formation of ions and radicals.

For example, when the deuterium compound is $ND_3$, an $ND_2$ radical, a D radical, an $ND_2$ ion and a D ion are formed.

FIG. 2 is a sectional view which shows an example of a section structure of the unprocessed workpiece substrate 12. The substrate of FIG. 2 has a structure in which an underlayer film 31 formed on a silicon substrate 30, an organic film 32 formed on the underlayer film 31, and a patterned protective film 33 formed on the organic film 32 are laminated in order.

The underlayer film 31 is, for example, a silicon oxide film. The organic film 32 is, for example, a hydrocarbon film. The protective film 33 is, for example, a silicon oxide film. Upon the protective film 33 is formed a pattern having a trench-like opening 34 by the photolithography process, for example. This protective film 33 serves as a mask when plasma etching is performed for the organic film 32.

The workpiece substrate 12 shown in FIG. 2 is disposed in the chamber 11 of FIG. 1, and then $ND_3$ gas is introduced as a deuterium compound gas into the chamber 11. When the $ND_3$ gas is excited by the high-frequency power source 17, a plasma is generated in the chamber 11, thereby generating an $ND_2$ ion, a D ion, an $ND_2$ radical and a D radical.

FIG. 3 is a sectional view which shows an example of a section structure of the processed workpiece substrate 12. As shown in the figure, the organic film 32 is etched by the generated plasma via the opening 34 of the protective film 33 and a trench 35 is formed in the organic film 32.

When this trench 35 reaches the underlayer film 31, the underlayer film 31 is then irradiated with an $ND_2$ ion and a D ion. Therefore, during a period until the excitation by the high-frequency power source 17 is stopped, the $ND_2$ ion and the D ion enter the underlayer film 31 and damage occurs in the ion entry region 36 of the underlayer film 31.

The entry depth of the $ND_2$ ion and the D ion in a region where such damage has occurred (hereinafter, referred to as a damaged region) can be measured by a SIMS (Secondary Ion Mass Spectroscopy) analysis or Auger Electron Spectroscopy.

For example, when ion energy is 200 to 1000 eV and the underlayer film 31 is a silicon oxide film, the entry depth of the D ion is 4 to 15 nm or so and the entry depth of the $ND_2$ ion is 1.5 to 4 nm or so.

Figure 4B:
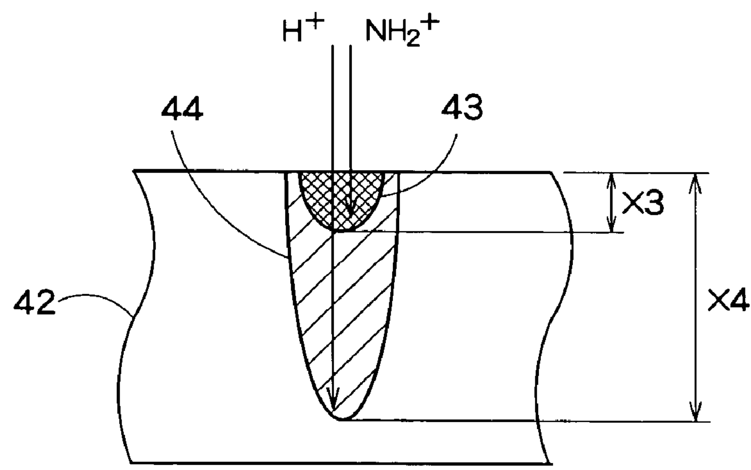
FIG. 4B is a sectional view which schematically shows a damaged region when plasma etching is performed using a gas which contains an ordinary hydrogen compound $NH_3$ in place of a deuterium compound or a trideuterium compound.

FIG. 4A is a sectional view which schematically shows a damaged region of this embodiment, and FIG. 4B is a sectional view which schematically shows a damaged region when plasma etching is performed using a gas which contains an ordinary hydrogen compound $NH_3$ in place of a deuterium compound or a trideuterium compound.

As shown in FIG. 4A, when an $ND_2$ ion and a D ion are applied to the underlayer film 31, an entry region 40 of $ND_2$ ion and an entry region 41 of D ion are formed.

Because of a mass difference between the $ND_2$ ion and the D ion, the velocity of the D ion with a smaller mass is higher with the same ion energy. As a result, the $ND_2$ ion enters up to a distance X1, whereas the D ion enters deeper up to a distance X2, causing damage to the underlayer film 31.

On the other hand, as shown in FIG. 4B, when an $NH_2$ ion and an H ion are applied to the underlayer film 42, an entry region 43 of $NH_2$ ion and an entry region 44 of H ion are formed.

Because of a mass difference between the $NH_2$ ion and the H ion, the velocity of the H ion with a smaller mass is higher than that of the $NH_2$ ion when compared with the same ion energy.

As a result, the $NH_2$ ion enters up to a distance X3, whereas the H ion enters deeper than a distance X4, causing damage to the underlayer film 42.

However, because the mass of the $NH_2$ ion is smaller than the mass of the $ND_2$ ion, the entry distance X3 of the $NH_2$ ion becomes longer than the entry distance X1 of the $ND_2$ ion.

Also, because the mass of the H ion is smaller than the mass of the D ion, the entry distance X4 of the H ion is longer than the entry distance X2 of the D ion.

As a result, the damaged region of the underlayer film 31 extends up to the distance X2, whereas the damaged region of the underlayer film 42 extends up to the distance X4, and the damage of the underlayer film 42 becomes larger than that of the underlayer film 31.

According to experiments by the present inventor, it was ascertained that the entry distance X2 of the D ion into the underlayer film 31 decreases to about 1/1.5 of the entry distance X4 of the H ion into the underlayer film 42.

Therefore, according to plasma etching using $ND_3$ gas, the depth of the damaged region of the underlayer film 31 can be reduced to about 1/1.5, compared with plasma etching using $NH_3$ gas.

Furthermore, the $ND_3$ gas has an etching rate of the organic film 32 which is about twice higher than the single $D_2$ gas. Because of this, according to this embodiment, it is possible to reduce the damage to the underlayer film 31 and to increase the etching rate.

While an $ND_2$ ion and a D ion are being applied to the underlayer film 31, side walls of the organic film 32 removed by etching are exposed to an $ND_2$ radical and a D radical. Because the D radical is more active than the $ND_2$ radical, mainly the D radical reacts with the carbon in the organic film 32, and carbon deuterium (CD) generated as a reaction product. Therefore, the organic film 32 is etched in a horizontal direction of the substrate, in order to form an undercut region.

FIG. 5 is a sectional view which shows an example in which side wall parts of the organic film 32 are etched mainly by a D radical and an undercut region 36 is formed. On the other hand, FIG. 6 is a sectional view which shows an undercut region 36 of the organic film 32 when plasma etching has been performed by using a gas which contains a hydrogen compound $NH_3$.

The D radical enters into the undercut region 36 with the depth X5. Because of a mass difference between the D radical and the H radical, the temperature of the H radical is higher than that of the D radical. Therefore, the H radical reacts easily with the organic film 32. As a result, a large undercut with the depth X6 is formed to generate a deeper undercut region 36 along the side wall of the trench. In other words, in order to etch the organic film 32, the bond between atoms which constitute the organic film 32 must be cut and energy is required for this purpose. The energy depends on the temperature of a radical, and the higher the temperature is, the larger the energy becomes. Because the H radical has a higher temperature than the D radical, the H radical cuts more bonds than the D radical and a larger undercut region 36 is formed in the organic film 32.

The large size of the undercut region 36 of the organic film 32 means that the widthwise dimensional accuracy of the trench is low. Therefore, the widthwise dimensional accuracy during etching is higher when plasma etching is performed by using a gas which contains a deuterium compound than when plasma etching is performed by using a gas which contains a hydrogen compound.

As stated above, because in the first embodiment, the organic film 32 is processed by plasma etching using a gas which contains a deuterium compound, a D ion having a lower rate than an H ion is applied to the underlayer film 31 and damage occurring in the underlayer film 31 can be reduced. Therefore, a semiconductor device which has stable device characteristics, high reliability and a high accumulation level can be realized.

Also, when plasma etching is performed by using a gas which contains a deuterium compound as in this embodiment, the widthwise undercut region 36 of the patterned organic film 32 can be further reduced and the widthwise dimensional accuracy during etching can be further improved.

In the above-described embodiment, the description has been given of an example in which $ND_3$ is used as a gas which contains a deuterium compound. However, the gas may contain as a deuterium compound, in place of $ND_3$ or along with $ND_3$, at least one of $D_2O$, $NH_2D$, $NHD_2$, $CH_3D$, $CH_2D_2$, $CHD_3$ and $CD_4$. That is, even when the gas is a deuterium compound gas in which deuterium is substituted for part of the hydrogen in a hydrogen compound gas, the gas can reduce the depth of the damaged region of the underlayer film 31 according to the substitution ratio of deuterium for hydrogen.

Also, the above-described embodiment has been described in the case where the underlayer film 31 and the protective film 33 are both a silicon oxide film. However, the underlayer film 31 may be a Low-k film silicon body or a silicon nitride film, and the protective film 33 may be a silicon nitride film, a silicon carbide film or a metal film.

Incidentally, in the above-described embodiment, the description has been given in terms of an example in which a trench is formed by removing part of the organic film 32 on the underlayer film 31 by plasma etching. However, the gas which contains the deuterium compound or the trideuterium compound can be further applied to the organic film in a case where the patterned organic film is used as a mask to perform patterning of the underlayer film 31, and the organic film used as the mask is removed by plasma etching.

Figure 7:
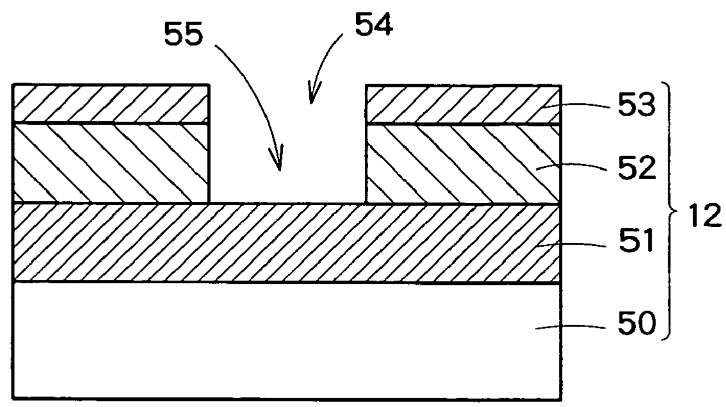
FIG. 7 is a sectional view which shows an example in which a workpiece substrate 12 has an organic film 53 which covers a patterned dielectric film 52.

FIG. 7 is a sectional view which shows an example in which a workpiece substrate 12 has an organic film 53 which covers a patterned dielectric film 52. The workpiece substrate 12 in FIG. 7 has a structure in which an underlying film 51 formed on a silicon substrate 50, a dielectric film 52 which functions as a underlayer film patterned on the underlying film 51, and an organic film 53 which covers the dielectric film 52 as the mask are laminated. The organic film 53 has an opening 54.

The underlying film 51 is, for example, a silicon oxide film. The dielectric film 52 is, for example, what is called a Low-k film (a low dielectric constant film) which contains, as main components, carbon (C), silicon (Si) and oxygen (O). The organic film 53 is, for example, a photoresist and is patterned beforehand. A trench 55 is formed in the dielectric film 52 by using the patterned organic film 53 as the mask.

Figure 8:
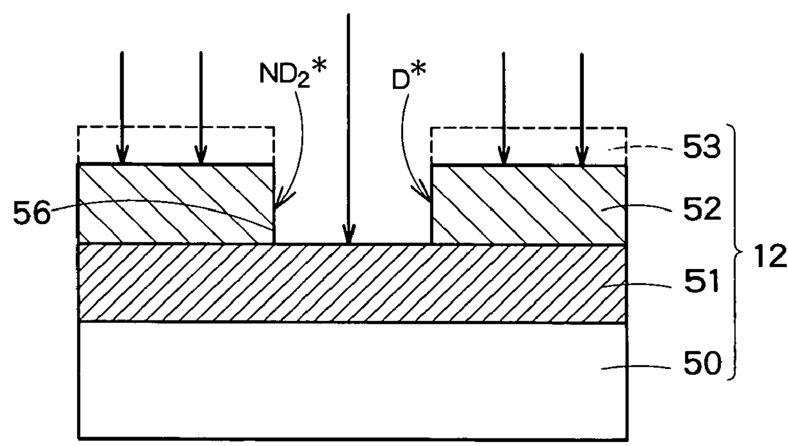
FIG. 8 is a sectional view showing an example in which the organic film is etched by the generated plasma.

When the workpiece substrate which is shown in FIG. 7 is subjected to plasma etching by using a gas which contains a deuterium compound or a trideuterium compound as in the first embodiment (for example, $ND_3$ gas), as shown in FIG. 8, an organic film 53 is etched by a generated plasma.

At this time, an $ND_2$ radical and a D radical generated by the plasma collide against side walls 56 of the trench 55 in the dielectric film 52, mainly the D radical reacts with the carbon in the dielectric film 52, and damage occurs due to pullout of carbon.

The extent of this damage is smaller than when plasma etching is performed by using an ordinary hydrogen compound. The reason for this is that the temperature of the D radical becomes lower than the temperature of the H radical and that the energy used to cut bonds between atoms of the dielectric film is lower in the D radical.

Therefore, also in a case where as shown in FIG. 7, the organic film 53 on the dielectric film 52 is removed by plasma etching, the widthwise dimensional accuracy of the dielectric film 52 can be improved.

Second Embodiment

In a second embodiment, an opening in which interconnections of dual-damascene structure is formed is formed by plasma etching.

FIG. 9 is a manufacturing process diagram which shows a method of manufacturing a semiconductor device related to the second embodiment of the present invention. First, a laminated substrate in which a via hole 61 is formed is prepared. This laminated substrate has a substrate 63 in which a Cu interconnection layer 62 is formed and a laminated film 64 formed on this substrate 63. This laminated film 64 is obtained by laminating a porous film 65, an organic film 66 formed on the porous film 65 and a protective film 67 formed on the organic film 66.

The porous film 65 is, for example, an insulating film formed from SiCOH as a material. The protective film 67 is formed of a silicon oxide film or a Low-k film as a material. The protective film 67 is used as a protective mask during plasma etching, and patterned to overlap with a via hole 61 beforehand in conformity to the shape of the organic film 66 which is removed by plasma etching.

In this embodiment, the laminated substrate of FIG. 9 is disposed within the chamber 11 of FIG. 1 and a gas which contains a deuterium compound or a trideuterium compound is introduced into the chamber 11, whereby plasma etching is started. The pressure in the chamber 11 and the applied high-frequency voltage are similar to the first embodiment. As a result, the gas which contains a deuterium compound or a trideuterium compound is excited and a plasma is generated under the formation of ions and radicals.

For example, when a gas which contains a deuterium compound consisting of $ND_3$ is introduced into the chamber 11, an $ND_2$ ion, a D ion, an $ND_2$ radical and a D radical are formed.

As shown in FIG. 10, the organic film 66 is etched and removed by the generated ions along the pattern shape of the protective film 67 and a trench 68 is formed. At the same time, the ions enter the top surfaces of the protective film 67, the porous film 65 and the substrate 63, and damage occurs in the entry region of the ions. The radicals formed by the plasmas collide against side walls of the organic film 66 and remove the side walls of the organic film 66.

As described above, by performing plasma etching, damage occurs to the top surfaces of the protective film 67, porous film 65 and substrate 63 and an undercut region 69 is formed on the side walls of the organic film 66.

Because in this embodiment a gas which contains a deuterium compound or a trideuterium compound is introduced into the chamber 11, the damage given to the protective film 67, the porous film 65 and the substrate 63 can be reduced compared with a case where a gas which contains a ordinary hydrogen compound is introduced. As a result of this, device characteristics become stable and a semiconductor device having high reliability can be obtained. Although the undercut region 69 is formed by the generated radicals on the side walls of the organic film 66, the size of the undercut region 69 can be reduced compared with a case where a gas which contains a usual hydrogen compound is used, and the widthwise dimensional accuracy of the trench 68 can be improved.

Next, as shown in FIG. 11, Cu 70 is filled in the inside of the via hole 61 and the trench 68 formed by plasma etching. After that, if necessary, the surface is polished by a required amount by CMP (Chemical Mechanical Polishing), to form the interconnection of the dual-damascene structure.

Although FIG. 9 shows an example in which the via hole 61 is formed beforehand in the laminated film 64, the via hole 61 is not always necessary and part of the organic film 66 on a porous film 65 with no via hole 61 may be removed by etching.

As described above, in the second embodiment, the organic film 66 is subjected to plasma etching by introducing a gas which contains a deuterium compound or a trideuterium compound into the chamber 11 for the purpose of forming an interconnection embedding region in the laminated film 64 constituted by the porous film 65, the organic film 66 and the protective film 67. Therefore, it is possible to form the opening excellent in dimensional accuracy while reducing the damage caused to the porous film 65, the organic film 66 and the protective film 67.

What is claimed is:

1. A method of processing an organic film, comprising:

disposing a substrate on which the organic film is formed in a chamber capable of reducing a pressure therein;

introducing a gas including a deuterium compound in the chamber, to generate a plasma by ionizing the gas; and etching and patterning the organic film by ions in the plasma, the ions having ion energy of 200 to 1000 eV.

2. The method of processing the organic film according to claim 1, wherein the deuterium compound is $D_2O$, $NH_2D$, $NHD_2$, $ND_3$, $CH_3D$, $CH_2D_2$, $CHD_3$ or $CD_4$ (D denotes deuterium).

3. The method of processing the organic film according to claim 1, wherein the substrate is provided with an underlayer film formed between a silicon substrate and the organic film, and a patterned protective film formed on the organic film.

4. The method of processing the organic film according to claim 3, wherein the underlayer film is a silicon oxide film.

5. The method of processing the organic film according to claim 3, wherein the underlayer film is a Low-k film.

6. A method of processing an organic film, comprising:

disposing a substrate on which the organic film covered by a patterned protective film is formed in a chamber capable of reducing a pressure therein;

introducing a gas including a deuterium compound in the chamber, to generate a plasma by ionizing the gas; and etching the organic film by ions in the plasma by using the protective film as a mask, the ions having ion energy of 200 to 1000 eV.

7. The method of processing the organic film according to claim 6, wherein the deuterium compound is $D_2O$, $NH_2D$, $NHD_2$, $ND_3$, $CH_3D$, $CH_2D_2$, $CHD_3$ or $CD_4$ (D denotes deuterium).

8. The method of processing the organic film according to claim 7, wherein the substrate is provided with an underlayer film formed between a silicon substrate and the organic film.

9. The method of processing the organic film according to claim 8, wherein the underlayer film is a silicon oxide film.

10. The method of processing the organic film according to claim 8, wherein the underlayer film is a Low-k film.

11. A method of manufacturing a semiconductor device, comprising:

disposing a substrate which has a laminated film obtained by laminating an insulating film, an organic film and a patterned protective film in order in a chamber capable of reducing a pressure therein;

introducing a gas including a deuterium compound in the chamber, to generate a plasma by ionizing the gas; and etching the organic film by ions in the plasma by using the protective film as a mask, the ions having ion energy of 200 to 1000 eV.

12. The method of manufacturing the semiconductor device according to claim 11, wherein the insulating film is a porous film.

13. The method of manufacturing the semiconductor device according to claim 11, wherein the deuterium compound is $D_2O$, $NH_2D$, $NHD_2$, $ND_3$, $CH_3D$, $CH_2D_2$, $CHD_3$ or $CD_4$ (D denotes deuterium).

14. The method of manufacturing the semiconductor device according to claim 11, wherein the laminated film is provided with a via hole which penetrates the insulating film, the organic film and the protective film and overlaps with a portion in which the protective film is patterned, a width of a trench obtained by etching the organic film by the plasma being larger than a diameter of the via hole.

15. The method of manufacturing the semiconductor device according to claim 14, wherein a conductive layer is formed under the laminated film in conformity with a location of the via hole.

16. The method of manufacturing the semiconductor device according to claim 14, further comprising:

forming a conductive material in the inside of the via hole, the inside of the trench and on an upper face of the substrate, after etching the organic film by the plasma.

17. The method of manufacturing the semiconductor device according to claim 16, further comprising:

polishing an upper face of the substrate, after forming the conductive material.

* * * * *